United States Patent [19]
Fujishiro et al.

[11] 4,137,370
[45] Jan. 30, 1979

[54] TITANIUM AND TITANIUM ALLOYS ION PLATED WITH NOBLE METALS AND THEIR ALLOYS

[75] Inventors: Shiro Fujishiro, Yellow Springs; Daniel Eylon, Dayton, both of Ohio

[73] Assignee: The United States of America as represented by the Secretary of the Air Force, Washington, D.C.

[21] Appl. No.: 825,005

[22] Filed: Aug. 16, 1977

[51] Int. Cl.² .................................. B32B 15/00
[52] U.S. Cl. ............................ 428/660; 427/38; 428/668; 428/670; 428/926
[58] Field of Search ............... 427/38; 428/660, 668, 428/670, 926

[56] References Cited

U.S. PATENT DOCUMENTS

| | | | |
|---|---|---|---|
| 2,842,463 | 7/1958 | Bond et al. | 428/660 |
| 3,278,404 | 10/1966 | Cotton et al. | 428/670 |
| 3,297,552 | 1/1967 | Gisser et al. | 428/660 |
| 3,474,520 | 10/1969 | Takizawa et al. | 428/670 |
| 3,686,036 | 8/1972 | Gereth et al. | 428/670 |
| 3,816,079 | 6/1974 | Bachmann et al. | 428/660 |

FOREIGN PATENT DOCUMENTS

| | | | |
|---|---|---|---|
| 1188895 | 3/1965 | Fed. Rep. of Germany | 428/670 |
| 1816107 | 10/1970 | Fed. Rep. of Germany | 428/670 |
| 2102633 | 4/1972 | France | 428/660 |
| 1051994 | 12/1966 | United Kingdom | 428/670 |

OTHER PUBLICATIONS

IBM Technical disclosure bulletin, vol. 16, No. 1, 6/73, p. 39.

*Primary Examiner*—Arthur J. Steiner
*Attorney, Agent, or Firm*—Joseph E. Rusz; Cedric H. Kuhn

[57] ABSTRACT

Components fabricated from titanium and titanium alloys are subjected to an ion plating with noble metals or their alloys. The structures so treated are highly resistant to oxidation at elevated temperatures and possess improved mechanical properties.

3 Claims, No Drawings

TITANIUM AND TITANIUM ALLOYS ION PLATED WITH NOBLE METALS AND THEIR ALLOYS

RIGHTS OF THE GOVERNMENT

The invention described herein may be manufactured and used by or for the Government of the United States for all governmental purposes without the payment of any royalty.

FIELD OF THE INVENTION

This invention relates to titanium and titanium alloys which are resistant to oxidation and possess outstanding mechanical properties. In one aspect it relates to a method for treating titanium and titanium alloys so as to provide improved mechanical properties, particularly at elevated temperatures.

BACKGROUND OF THE INVENTION

A large amount of research work has been directed toward the development of materials suitable for use in fabricating jet engine parts and other aircraft and aerospace components. A suitable material must be light weight and resistant to oxidation while having high creep, fatigue and tensile strength. Examples of such components include compressor blades, engine casings, heat panels and exhaust gas ducts.

A leading candidate material for the above-mentioned applications is titanium, particularly titanium alloys. However, the use of titanium alloy components is limited by the alloy's high reactivity with oxygen and the formation of an unstable oxide layer, resulting in a degradation of mechanical properties.

As disclosed by C. Hood in Platinum Metals Review 20, 48-52 (1976), various methods have been employed to coat platinum group metals on metal substrates. The following coating methods are disclosed by the author: vacuum deposition, thermal decomposition and chemical vapour plating, electroless plating, aqueous electroplating, fused salt electroplating, metallic bonding and metallizing. These various methods do not provide satisfactory protective coatings for titanium and titanium alloys. There is inadequate cohesion between the coatings and substrate for high temperature, long time exposure so that the coatings tend to separate or spall under these conditions.

In "Ion Implantation", 729-738, Vol. 8 (1973) of a series of books published by North-Holland Publishing Company Ltd. - London, G. Dearnaley et al discuss corrosion studies in ion implanted metals. According to the Authors, the metal ion species, arranged in order of their effectiveness in inhibiting the thermal oxidation of titanium at 600° C are as follows: calcium, europium, cerium, yttrium, zinc, aluminum, indium, nickel and bismuth. While implantation of the metal ions disclosed by the authors do apparently provide a degree of protection against oxidation of titanium, mere ion implantation with the particular metal ions disclosed is ineffective in plating titanium or titanium alloy components with an oxidation-resistant protective coating so as to provide improved mechanical properties.

It is an object of this invention, therefore, to provide a titanium or titanium alloy component having a stable impregnated coating or layer of an oxidation resistant noble metal or an alloy of noble metals without causing degradation of mechanical properties.

Another object of the invention is to provide a titanium or titanium alloy component which, as a result of having an ion plated noble metal or noble metal alloy coating, possesses mechanical properties superior to those of uncoated components.

A further object of the invention is to provide a method for treating components fabricated from titanium and titanium alloys so as to obtain components which are resistant to oxidation and possess improved mechanical properties.

SUMMARY OF THE INVENTION

Broadly speaking, the present invention resides in a component or structure formed from titanium or a titanium alloy, the component having an ion plated coating of a noble metal or noble metal alloy.

More specifically, the present invention lies in an article of manufacture comprising a component fabricated from titanium or a titanium alloy, the component having a noble metal or noble metal alloy ion plated coating with a thickness of about 0.5 to 1.5 microns cohesively bonded to noble metal or noble metal alloy ion implanted surfaces of the component.

The ion plated noble metal coating protects the underlying titanium or titanium alloy, which is highly reactive with oxygen, other atmospheric gases and chemicals. The mechanical properties of the titanium or titanium alloy, such as fatigue, creep and postcreep tensile ductility, are thereby increased both at room temperature and at elevated temperatures.

In one embodiment, the invention lies in a method for treating a component fabricated from titanium or a titanium alloy so as to render it highly resistant to oxidation. In accordance with the method, ions of a noble metal or noble metal alloy are initially implanted in the substrate by impinging the ions thereon until saturation of the substrate with the metal ions occurs. Thereafter, impingement of the metal ions on the substrate, which is now saturated with metal ions, is continued, thereby forming a coating or film of a noble metal or noble metal alloy on the substrate.

From the foregoing it is seen that the present method inherently involves a two-stage process. Firstly, there is the impregnation stage in which the ionized metal atoms are forced, i.e., implanted, into the substrate. Secondly, the ions are plated out onto the ion implanted substrate, forming a protective coating. The two stages of the process can be termed ion implantation and ion plating, respectively. It is the combination of ion implantation and ion plating which makes possible the cohesive coating which is resistant to oxidation and which is not subject to separation or spalling upon exposure to high temperatures for extended periods of time. The initial ion implantation is an important and essential step prior to the ion plating since the ion implanted substrate provides a sound and stable base that is conducive to film formation by ion plating because of the atomistic cohesion between the implanted ions and the plated ions.

Procedures and apparatus described in the literature for conducting ion implantation can be used in the practice of the present invention. As an ion implantation apparatus, a standard model equipment manufactured by Temescal, a division of AIRCO, Berkeley, California, can be conveniently employed. The bias potential between the molten noble metal or noble metal alloy source (anode) and the component substrate (cathode) usually ranges from about 2 to 4.5 KV. The ion current generally falls in the range of about 30 to 90 mA. The vacuum chamber is evacuated to $1 \times 10^{-6}$ torr and back-filled with argon up to 3 to 5 microns pressure. The two stages, i.e., ion implantation and ion plating, usually take from about 2 to 5 minutes.

As used herein, the term noble metal includes ruthenium (Ru), rhodium (RH), palladium (Pd), osmium (Os), iridium (Ir), gold (Au) and platinum (Pt). As previously indicated, it is within the scope of the invention to use alloys of the metals. An example of a preferred alloy is 80 percent platinum and 20 percent rhodium. It is often preferred to employ platinum in the practice of the invention.

The present invention is particularly applicable to titanium alloys which are described in detail in the literature. However, titanium per se can be treated with advantage in accordance with the method of this invention.

A more complete understanding of the invention can be obtained by referring to the following illustrative examples which are not intended, however, to be unduly limitative of the invention.

EXAMPLE I

A series of runs was conducted in which specimens of a titanium alloy (Ti-6Al-2Sn-4Zr-2Mo) were treated according to the method of this invention. In each run, using an ion implantation apparatus (Temescal), the bias potential between a molten Pt source (anode) and the specimen (cathode) and the ion current were 3 KV and 60 mA, respectively. The vacuum chamber was evacuated to $1 \times 10^{-6}$ torr and then back-filled with argon up to 3 microns in pressure. Duration of each run was 2 minutes. As a result of the treatment, each specimen was ion plated with a coating of Pt.

The Pt coated specimens were subjected to fatigue tests, using a Schenck fatigue test machine (6 ton capacity). The tests were carried out at room temperature and at 850° F. In each test R equalled 0.1 where R is the ratio of minimum applied stress to maximum applied stress ($R = [\sigma min/\sigma max] = 0.1$). Control tests were also conducted in which uncoated Ti alloy specimens were used. The results of the tests are shown below in the table.

TABLE

| Test No. | Room Temperature Applied Stress, psi | No. of cycles to failure |
|---|---|---|
| 1 (Control) | 115,000 | $3 \times 10^6$ |
| 2 (Control) | 115,000 | $2.5 \times 10^6$ |
| 3 (Coated) | 120,000 | $1 \times 10^7$ |
| 4 (Coated) | 120,000 | $1.5 \times 10^7$ |
| Temperature: 850° F | | |
| 5 (Control) | 90,000 | $8 \times 10^5$ |
| 6 (Control) | 98,000 | $4 \times 10^5$ |
| 7 (Control) | 105,000 | $2.5 \times 10^4$ |
| 8 (Coated) | 90,000 | $1 \times 10^7$ |
| 9 (Coated) | 98,000 | $5 \times 10^7$ |
| 10 (Coated) | 105,000 | $2 \times 10^7$ |

Creep tests were also conducted on a conventional creep frame "Arcweld 12000", using weights for loading. The minimum creep rate for the Pt coated Ti alloy specimens at 1050° F and 35,000 psi was $2 \times 10^5$ in/in/hour. This rate was about one-half of that of the uncoated specimens.

EXAMPLE II

A run was carried out in which Ti alloy specimens treated as described in Example I and having a 1 micron thick Pt coating were exposed to air at 1100° F for 400 hours. There were no appreciable weight gains ($4.5 \times 10^{-4}$ g/cm$^2$) after this exposure. This indicates an extremely high oxidation resistance as the weight gains for the uncoated Ti alloy under the same test conditions were $2 \times 10^{-2}$ g/cm$^2$. Scanning electron microscopic observation indicated no spalling of the coating at the boundary.

EXAMPLE III

Runs were conducted in which the procedure described in Example I was followed in applying Pt and Au coatings on specimens of Ti-6Al-2Sn-1.5Zn-1Mo-0.35Bi-0.1Si alloy. Creep tests were performed at 1050° F on the coated specimens as well as on uncoated (Control) specimens. Total creep strains were reduced by about 50 percent as a result of the ion plated coatings of the invention specimens.

EXAMPLE IV

A stage 8 compressor blade for a F100 engine made of Ti-6Al-2Sn-4Zr-6Mo alloy was ion plated with Pt as described in Example I. An oxidation test was performed on the blade at 1000° F for 500 hours. A scanning microscopic study revealed that there was no separation or spalling at the boundary between the coating and blade surface.

From the foregoing it is seen that a noble metal coating applied to a titanium alloy component in accordance with the method of this invention renders the component resistant to oxidation. Furthermore, the coated components have improved mechanical properties, e.g., increased fatigue strength and reduced creep strain, as compared to uncoated components. Also, the noble metal coating adheres tenaciously to its Ti alloy substrate without the separation or spalling to which coatings applied by conventional method are subject.

As will be evident to those skilled in the art, modifications of the present invention can be made in view of the foregoing disclosure without departing from the spirit and scope of the invention. For example, the ion plated coating of the titanium or titanium alloy can be used as a substrate for further coatings by conventional techniques, such as electroplating or sputtering.

We claim:

1. An article of manufacture comprising a component fabricated from titanium or a titanium alloy, the component having a noble metal or noble metal alloy ion plated coating having a thickness ranging from about 0.5 to 1.5 microns cohesively bonded to noble metal or noble metal alloy ion implanted surfaces of the component, the noble metal being ruthenium, rhodium, palladium, osmium, iridium, gold or platinum.

2. The article of manufacture according to claim 1 in which the component has an ion plated coating of platinum cohesively bonded to platinum ion implanted surfaces of the component.

3. The article of manufacture of claim 1 in which the component is a compressor blade of a jet engine.

* * * * *